(12) United States Patent
Tsao et al.

(10) Patent No.: US 6,656,827 B1
(45) Date of Patent: Dec. 2, 2003

(54) ELECTRICAL PERFORMANCE ENHANCED WAFER LEVEL CHIP SCALE PACKAGE WITH GROUND

(75) Inventors: Pei-Haw Tsao, Taichung (TW); Chender Huang, Hsin-Chu (TW); Jones Wang, Taipei (TW); Ken Chen, Hsinchu (TW); Hank Huang, Jungli (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/272,629

(22) Filed: Oct. 17, 2002

(51) Int. Cl.[7] ............................................. H01L 21/44
(52) U.S. Cl. ...................................... 438/612; 438/700
(58) Field of Search ................................. 438/612, 613, 438/614, 652, 674, 700

(56) References Cited

U.S. PATENT DOCUMENTS 6,153,829 A * 11/2000 Carapella et al.

* cited by examiner

*Primary Examiner*—Phuc T. Dang
(74) *Attorney, Agent, or Firm*—Tung & Associates

(57) ABSTRACT

A method including providing a first substrate having a first bond pad and a second bond pad; forming a subassembly comprising securing a second substrate to the first substrate with a ground layer interposed between the first substrate and the second substrate; forming a first trench in the subassembly through the first substrate so that the trench is defined at least in part by a side wall of the first substrate and through at least a portion of the ground layer; and forming a first electrically conductive layer overlying the first bond pad, the side wall of the first substrate and overlying a portion of the ground layer.

20 Claims, 4 Drawing Sheets

ELECTRICAL PERFORMANCE ENHANCED WAFER LEVEL CHIP SCALE PACKAGE WITH GROUND

FIELD OF THE INVENTION

The invention relates to the microelectronic devices, and more particularly to a microelectronic device including a ground layer and method of making the same.

BACKGROUND OF THE INVENTION

It is known to make microelectronic conductor devices, such as semiconductor devices, using a redistribution layer to connect a bond pad and a solder bump that are laterally spaced apart. One such device is a wafer level chip scale package (WLCSP). From a manufacturing point of view, a WLCSP is just an improved version of a traditional solder-bumped flip chip, except that the solder bumps on a WLCSP are much larger, the printed circuit board assembly of a WLCSP is more robust, and the manufacture usually does not have to struggle with an underfill encapsulant. WLCSP and flip chip manufacture share common components and techniques, particularly solder bumping. A brief discussion of flip chip technology will be helpful in understanding the present invention which primarily relates to semiconductor devices having a redistribution layer connected to a solder bump such as WLCSP.

A flip chip microelectronic assembly includes a direct electrical connection of face down (that is, "flipped") electronic components onto substrates, such as ceramic substrates, circuit boards, or carriers using conductive bump bond pads of the chip. Flip chip technology is quickly replacing older wire bonding technology that uses face up chips with a wire connected to each pad on the chip.

The flip chip components used in flip chip microelectronic assemblies are predominantly semiconductor devices, however, components such as passive filters, detector arrays, and MEM devices are also being used in flip chip form. Flip chips are also known as "direct chip attach" because the chip is directly attached to the substrate, board, or carrier by the conductive bumps.

The use a flip chip packaging has dramatically grown as a result of the flip chip's advantages in size, performance, flexibility, reliability, and cost over other packaging methods and from the widening availability of flip chip materials, equipment and services. In some cases, the elimination of old technology packages and bond wires may reduce the substrate or board area needed to secure the device by up to 25 percent, and may require far less height. Further, the weight of the flip chip can be less than 5 percent of the old technology package devices.

Flip chips are advantageous because of their high-speed electrical performance when compared to other assembly methods. Eliminating bond wires reduces the delay in inductance and capacitance of the connection, and substantially shortens the current path resulting in a high speed off-chip interconnection.

Flip chips also provide the greatest input/output connection flexibility. Wire bond connections are generally limited to the perimeter of the chip or die, driving the die sizes up as a number of connections have increased over the years. Flip chip connections can use the whole area of the die, accommodating many more connections on a smaller die. Further, flip chips can be stacked in 3-D geometries over other flip chips or other components.

Flip chips also provided the most rugged mechanical interconnection. Flip chips when underfilled with an adhesive such as an epoxy, can withstand the most rugged durability testing. In addition to providing the most rugged mechanical interconnection, flip chips can be the lowest cost interconnection for high-volume automated production.

The bumps of the flip chip assembly serve several functions. The bumps provided an electrical conductive path from the chip (or die) to the substrate on which the chip is mounted. A thermally conductive path is also provided by the bumps to carry heat from the chip to the substrate. The bumps also provided part of the mechanical mounting of the chip to the substrate. A spacer is provided by the bumps that prevents electrical contact between the chip and the substrate connectors. Finally, the bumps act as a short lead to relieve mechanical strain between the chip and the substrate.

Flip chips are typically made by a process including placing solder bumps on a silicon wafer. The solder bump flip chip processing typically includes four sequential steps: 1) preparing the wafer for solder bumping; 2) forming or placing the solder bumps on the wafer; 3) attaching the solder bumped die to a board, substrate or carrier; and 4) completing the assembly with an adhesive underfill.

The first step in a typical solder bumping process involves preparing the semiconductor wafer bumping sites on bond pads of the individual integrated circuits defined in the semiconductor wafer. The preparation may include cleaning, removing insulating oxides, and preparing a pad metallurgy that will protect the integrated circuits while making good mechanical and electrical contact with the solder bump. Accordingly, protective metallurgy layers may be provided over the bond pad. Ball limiting metallurgy (BLM) or under bump metallurgy (UBM) generally consists of successive layers of metal. The "adhesion" layer must adhere well to both the bond pad metal and the surrounding passivation, provide a strong, low-stress mechanical and electrical connection. The "diffusion barrier" layer prevents the diffusion of solder into the underlying material. The "solder wettable" layer provides a wettable surface for the molten solder during the solder bumping process, for good bonding of the solder to the underlying metal.

A variety of UBM structures are known to those skilled in the art that accomplish the above functions and have one, two, three or more layers depending on whether the bump is gold, copper, aluminum, solder or nickel based. For gold based bumps, known UBM structure include layers of Cr—Cu, Ti—Pd, Ti—W, or Ti—Pt. For copper based bumps, known UBM structures include layers of Cr—Cu, or Al—Ni. For aluminum based bumps, known UBM structure include layers of Ti or Cr. For solder based bumps, known UBM structures include layers of Cr—Cu—Au, Ni—Cu, Ti—Cu, TiW—Cu, Ni—Au, or Al—NiV—Cu. For nickel based bumps, known UBM structure include layers of nickel. The UBM layers may be deposited by electroplating, evaporation, printing, electroless plating, and/or sputtering. It is also known to deposit one or more seed layers over the UBM structure prior to depositing the electrically conductive material (such as solder) that forms the bump.

In fabricating a flip-chip bond structure, the fabrication process requires a tight control of interface processes and manufacturing parameters in order to meet very small dimensional tolerances. Various techniques may be utilized to fabricate a UBM structure and to deposit the solder bump. A few widely used methods of depositing bumps include evaporation, electroplating, electroless plating and screen-printing. Kung et al, U.S. Pat. No. 6,179,200 provides a description of these more widely used methods of depositing bumps as follows.

The formation of solder bumps can be carried out by an evaporation method of Pb and Sn through a mask for producing the desired solder bumps. When a metal mask is used, UBM metals and solder materials can be evaporated through designated openings in the metal mask and be deposited as an array of pads onto the chip surface.

In one prior art evaporation method, a wafer is first passivated with an insulating layer such as $SiO_2$, via holes are then etched through the wafer passivation layer to provide a communication path between the chip and the outside circuit. After a molybdenum mask is aligned on the wafer, a direct current sputtering cleans the via openings formed in the passivation layer and removes undesirable oxides. A cleaned via opening assures low contact resistance and good adhesion to the $SiO_2$. A chromium layer is evaporated through a metal mask to form an array of round metal pads each covering an individual via to provide adhesion to the passivation layer and to form a solder reaction barrier to the aluminum pad underneath. A second layer of chromium/copper is then co-evaporated to provide resistance to multiple reflows. This is followed by a final UBM layer of pure copper which forms the solderable metallurgy. A thin layer of gold may optionally be evaporated to provide an oxidation protection layer. These metal-layered pads define the solder wettable regions on the chips, which are commonly referred to as the ball limiting metallurgy (BLM) or under bump metallurgy (UBM). After the completion of UBM, solder evaporation occurs through a metal mask, which has a hole diameter slightly greater than the UBM mask-hole diameter. This provides the necessary volume for forming a subsequent solder ball. A solder reflow process is performed at a temperature of about 350° C. to melt and homogenize the evaporated metal pad and to impart a truncated spherical shape to the solder bump. The evaporation method, even though well established and has been practiced for a long time in the industry, is a slow process and thus can not be run at a high throughput rate.

A second method for forming solder bumps is the electroplating method. In an electroplating process, UBM layers are first deposited, followed by the deposition of a photoresist layer, the patterning of the photoresist layer, and then the electro-deposition of a solder material into the photoresist openings. After the electro-deposition process is completed, the to photoresist layer can be removed and the UBM layers can be etched by using the plated solder bumps as a mask. The solder bumps are then reflowed in a furnace reflow process. The photolithography/electroplating technique is a simpler technique than evaporation and is less expensive because only a single masking operation is required. However, electroplating requires the deposition of a thick and uniform solder over the entire wafer area and etching metal layers on the wafer without damaging the plated solder layer. The technique of electroless plating may also be used to form the UBM structure.

Another solder bump formation technique that is capable of solder-bumping a variety of substrates is a solder paste screening method. The screen printing technique can be used to cover the entire area of an 8-inch wafer. In this method, a wafer surface covered by a passivation layer with bond pads exposed is first provided. UBM layers are then deposited on top of the bond pads and the passivation layer. A photoresist layer is deposited over the UBM The portions of the UBM are etched followed by stripping off the photoresist layer. A stencil is then aligned on the wafer and solder paste is squeegeed through the stencil to fill the openings on top of the bond pads and the UBM layers. After the stencil is removed, the solder bumps may be reflowed in a furnace to form solder balls.

One drawback of the solder paste screen printing process is that, with the recent trend in the miniaturization of device dimensions and the reduction in bump to bump spacing (or pitch), the prior art solder paste screening techniques become impractical. For instance, one of the problems in applying solder paste screening technique to modern IC devices is the paste composition itself. A paste in generally composed of a flux and solder alloy particles. The consistency and uniformity of the solder paste composition becomes more difficult to control with a decreasing solder bump volume. A possible solution for this problem is the utilization of solder paste that contains extremely small and uniform solder particles. However, this can only be achieved at a very high cost penalty. Another problem is using the solder paste screening technique in modern high-density devices is the reduced pitch between bumps. Since there is a large reduction in volume from a paste to the resulting solder bump, the screen holes must be significantly larger in diameter than the final bumps. It is therefore generally desirable to form solder bumps that are reflown into solder balls with a larger height and a larger pitch between the balls.

Several other methods are known to those skilled in the art for producing solder bumps on a semiconductor device. One such method is called the solder jet printing method. The solder jet printer method is based upon piezoelectric demand mode ink jet printing technology and is capable of producing and placing molten solder droplets 25–125 micrometers in diameter at rates of up to 2000 per second. In demand mode ink jet printing systems, a volumetric change in the fluid is induced either by the displacement of piezoelectric material that is coupled to the fluid or by the formation of the vapor bubble in the ink caused by heating a resistive element. The volumetric change causes pressure transience to occur in the fluid, and these are directed so as to produce a drop that issues from an orifice. A droplet is created only when it is desired in demand mode systems. Demand mode ink jet printing produces droplets that are approximately equal to the orifice diameter of the droplet generator.

Another method for producing solder bumps is known as the micro-punching method. In the micro-punching method, solder tape is supplied from a spool and rolled up by a motor driven spool. A micro-punch is driven by an electric actuator and a displacement enlarging mechanism. A micro-punch and die set blanks a thin solder tape and forms a small cylindrical piece. A solder flux may be formed over the entire semiconductor wafer to be bumped and the solder pieces may be punched and placed directly onto the wafer.

One of the most cost-effective packaging techniques is known as direct chip attach wherein a solder bumped flip chip is directly attached to a printed circuit board. However, due to the thermal expansion mismatch between the silicon chip and the printed circuit board (made from an epoxy or fiberglass material), an underfill encapsulant is usually needed for solder joint reliability. Due to the underfill operation, the manufacturing costs is increased in the manufacturing throughput is often substantially reduced. Further, reworking an underfill flip chip on a printed circuit board is practically impossible.

Another drawback of direct chip attach type microelectronic packaging techniques has to do with the pitch and size of the pads on the peripheral-arrayed chip. For direct chip attached assemblies, the bond pads are very small and result in high demand on the underlying printed circuit board.

Wafer level chip scale packages provide advantages over direct chip attached assemblies. In a wafer level chip scale package, a metal layer is used to redistribute the very fine pitched peripheral arrayed pads on the chip to much larger pitch area arrayed pads located in the interior portion of the upper face of the chip where larger solder joints may be provided for connection to the printed circuit board. Thus, the demands on the printed circuit board are much more relaxed using the wafer level chip sale packages.

FIG. 1 illustrates a wafer level chip scale package 100 including a square chip 112, which may be for example, approximately 9.64 by 9.64 mm. The integrated circuit chip 112 includes a silicon base with discrete devices formed therein and metal interconnects overlying the discrete devices in a manner known to those skilled in the art. A plurality of peripheral-arrayed bond pads 114 are provided over the metal interconnects. For example, the bond pads 114 typically may have a size of about 0.1 mm. by 0.1 mm and may be positioned with respect to each other at a pitch of about 0.25 mm. A metal layer or electrically conductive redistribution traces 116 are deposited on top of the wafer to redistribute the fine-pitched peripheral-arrayed bond pads 114 to a much larger pitch area-arrayed pads in the interior of the chip onto which larger solder bump connections 118 are provided. For example, the solder bump connections 118 may be formed on a redistribution pads having a pitch of about 0.75 and a pad size of about 0.3 mm in diameter.

SUMMARY OF THE INVENTION

One embodiment of the invention includes a microelectronic device including a first substrate, a second substrate, and a ground layer interposed between the first substrate and a second substrate; the first substrate including a plurality of bond pads, electrically conductive bumps, and redistribution traces, and wherein a first redistribution trace of the redistribution traces extends from one of the bond pads to the ground layer interposed between the first substrate on the second substrate.

In another embodiment of the invention the first substrate includes a top face and bottom face, and a side wall extending from the top face to the bottom face, and wherein the first redistribution trace extends from one of the bond pads to the ground layer over the side wall.

In another embodiment of the invention the first substrate includes a top face and bottom face, and a side wall extending from the top face to bottom face, and wherein the plurality of bond pads includes a first bond pad, and wherein the first redistribution trace extends from the first bond pad along the side wall of the first substrate to the ground layer, and further including a second redistribution trace extending generally horizontally from the first bond pad, and further including an electrically conductive bump electrically connected to the second redistribution trace.

Another embodiment of the invention further includes an electrically conductive post interposed between the second redistribution trace and the electrically conductive bump.

Another embodiment of the invention further includes an under bump metallurgy interposed between the second redistribution trace and the electrically conductive bump.

Another embodiment of the invention further includes an under bump metallurgy interposed between the electrically conductive post and the second redistribution trace.

Another embodiment of the invention further includes a seed layer interposed between the electrically conductive post and the second redistribution trace.

In another embodiment of the invention the electrically conductive post includes copper.

In another embodiment of the invention the bond pads includes aluminum.

In another embodiment of the invention the seed layer includes copper.

Another embodiment of the invention further includes a barrier layer interposed between the copper post in the second electrically conductive redistribution trace.

In another embodiment of the invention the ground layer includes gold.

In another embodiment of the invention the first electrically conductive trace covers the entire surface of the side wall of the first substrate.

In another embodiment of the invention the ground layer covers the entire surface of the bottom face of the first substrate.

In another embodiment of the invention the first substrate includes a semiconductor wafer.

In another embodiment of the invention the second substrate includes a glass based material.

In another embodiment of the invention the second substrate includes a second semiconductor wafer.

In another embodiment of the invention the second substrate includes a printed circuit board.

In another embodiment of the invention the second substrate includes a ceramic substrate.

Another embodiment of the invention includes a method including providing a first substrate having a first bond pad and a second bond pad; forming a subassembly including securing a second substrate to the first substrate with the ground layer interposed between the first substrate and a second substrate; forming a trench in the subassembly through the first substrate so that the trench is defined at least in part by a side wall of the first substrate and through at least a portion of the ground layer; and forming a first electrically conductive layer overlying the first bond pad, along the side wall of the first substrate and overlying the portion of the ground layer.

Another embodiment of the invention further includes an encapsulation layer overlying the subassembly and into the first trench.

Another embodiment of the invention further includes singulating individual packages from the semiconductor wafer, by cutting through the subassembly including the encapsulation layer at a location aligned with the first trench and through the second substrate so that the first electrically conductive layer electrically connects the first bond pad to the ground layer.

In another embodiment of the invention the first substrate and the second substrate are secured together by sonic bonding of the first substrate, ground layer and the second substrate.

In another embodiment of the invention the ground layer includes gold.

Another embodiment of the invention further includes forming a second electrically conductive redistribution trace from the first bond pad and so that the second electrically conductive redistribution trace extends generally horizontally a distance from the first bond pad, and forming an electrically conductive bump overlying the second redistribution trace so that the electrically conductive bump and the first bond pad are electrically connected together.

Another embodiment of the invention further includes forming a second electrically conductive redistribution trace from the first bond pad and so that the second electrically conductive redistribution trace extends generally horizontally a distance away from the first bond pad, forming an encapsulation layer overlying the second electrically conductive redistribution trace and an opening in the encapsulation layer, and further comprising forming a post in the opening in the encapsulation layer and overlying the second redistribution trace at a location laterally spaced from the first bond pad, and forming an electrically conductive bump overlying the post.

Another embodiment of the invention further includes forming a seed layer in the opening in the encapsulation layer prior to forming the post.

Another embodiment of the invention further includes forming an under bump metallurgy over the post prior to form the electrically conductive bump.

Another embodiment of the invention includes a microelectronic device including a first substrate having a top face, bottom face and a side wall extending from the top face to the bottom face; the first substrate including a plurality of bond pads, electrically conductive bumps, and redistribution traces and a ground layer on the bottom face of the first substrate, and wherein at least one of the redistribution traces extends from one of the bond pads to the ground layer.

Another embodiment of the invention includes a method including providing a first substrate having a top face, a bottom face, and wherein the first substrate includes a first bond pad and a second bond pad; forming a ground layer overlying the bottom face of the first substrate; forming a first trench through the first substrate so that the trench is defined at least in part by a side wall of the first substrate and through at least a portion of the ground layer, and forming a first selectively conductive layer overlying the bond pad to the side wall of the first substrate and overlying the portion of the ground layer.

These and other embodiments of the present invention will become apparent from the following brief description of the drawings, detailed description of the preferred embodiments, and appended claims and drawings.

DETAILED DESCRIPTION OF THE PREFERRED EMBODIMENTS

FIGS. 2A–H illustrate embodiments of a method of making a microelectronic device according to the present invention.

Figure 2A:
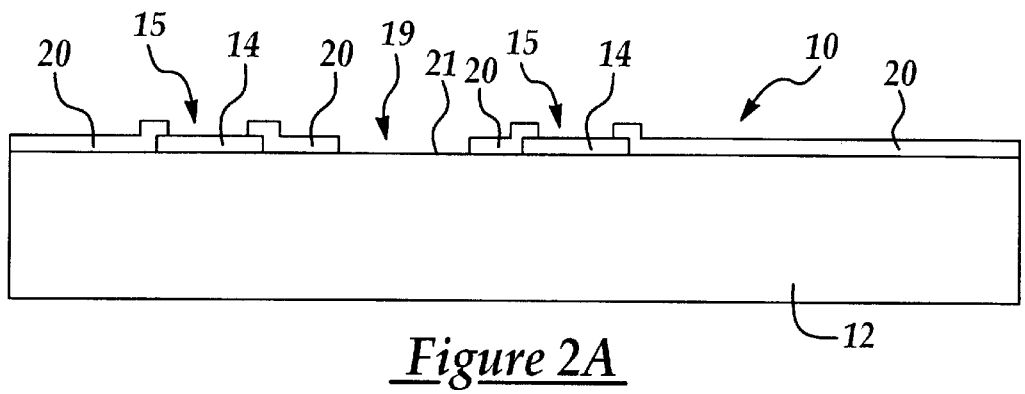
FIG. 2A is a sectional view illustrating an embodiment of the invention including providing a first substrate with a passivation layer and bond pads.

As shown in FIG. 2A, a semiconductor wafer 10 is provided which includes a silicon based substrate 12 having discrete electrical devices formed therein, for example, but not limited to, doped regions of a silicon wafer. The silicon based substrate 12 may also include a plurality of metallization layers and dielectric layers overlying the discrete electrical devices in a manner known to those skilled in the art. The upper metallization layer may include a bond pad 14. A first passivation layer 20 may be formed over the silicon based substrate 12 and may include a first opening 15 exposing a portion of the bond pad 14. A second opening 19 may also be provided in the passivation layer 20 exposing an upper surface 21 of the silicon based substrate 12. Alternatively, the first passivation layer 20 may cover the entire upper surface 21 of the silicon based substrate 12 with openings 15 only provided over the bond pads 14.

Figure 2B:
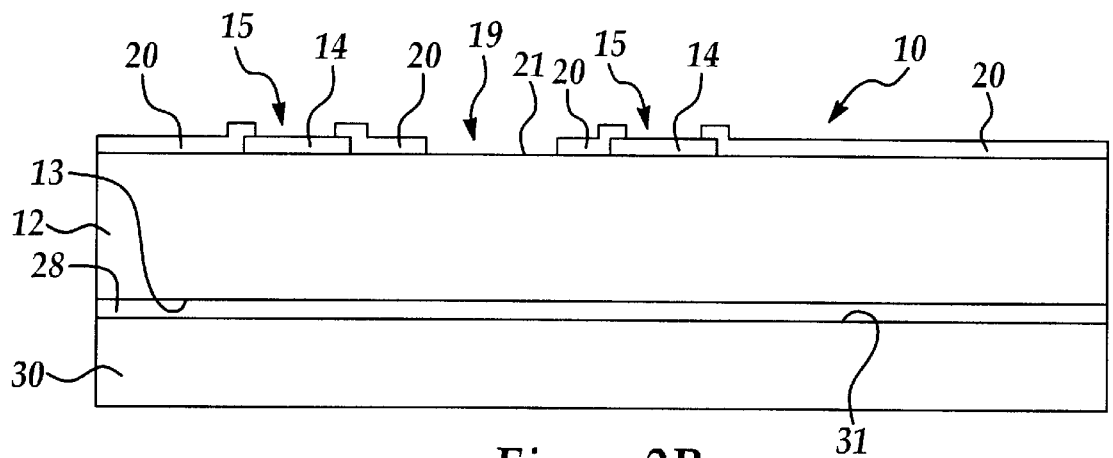
FIG. 2B illustrates an embodiment of the invention including forming a subassembly by securing a second substrate to the first substrate with the ground layer interposed between the first substrate and a second substrate.

As shown in FIG. 2B, a second substrate 30 is secured to the silicon based substrate 12 with an electrically conductive ground layer 28 interposed between the second substrate 30 and the silicon based substrate 12. The second substrate 30 may include any of a variety of materials sufficient for supporting the silicon based substrate 12 including, but not limited to, a second semiconductor wafer, a glass or silicon dioxide based substrate, ceramic substrates, organic based substrate, or printed circuit board. The electrically conductive ground layer 28 may be any of a variety of metal such as copper, gold, silver, solder, nickel, alloys and mixtures thereof, or electrically conductive composite or resin material. For example, gold may be deposited by electroplating or sputtering gold onto a bottom face 13 of the silicon base substrate 12 or onto the top face 31 of the second substrate 30. The silicon based substrate 12 and second substrate 30 may be secured together by reflowing the electrically conductive ground layer and cooling the same or securing the silicon based substrate 12, second substrate 30 and ground layer 28 using ultrasonic binding techniques known to those skilled in the art. The electrically conductive ground layer 28 may cover the entire bottom face 13 of the silicon based substrate or the top face 31 of the second substrate 30. Alternatively, the ground layer 28 may be individual electrical traces covering selected portions of the bottom face 13 of the silicon based substrate or the top face 31 of the second substrate 30 so that when the semiconductor wafer is singulated into individual chip packages, a ground layer 28 is provided on each chip package. The silicon based substrate 12, the ground layer 28, and second substrate 30 form a subassembly.

Figure 2C:
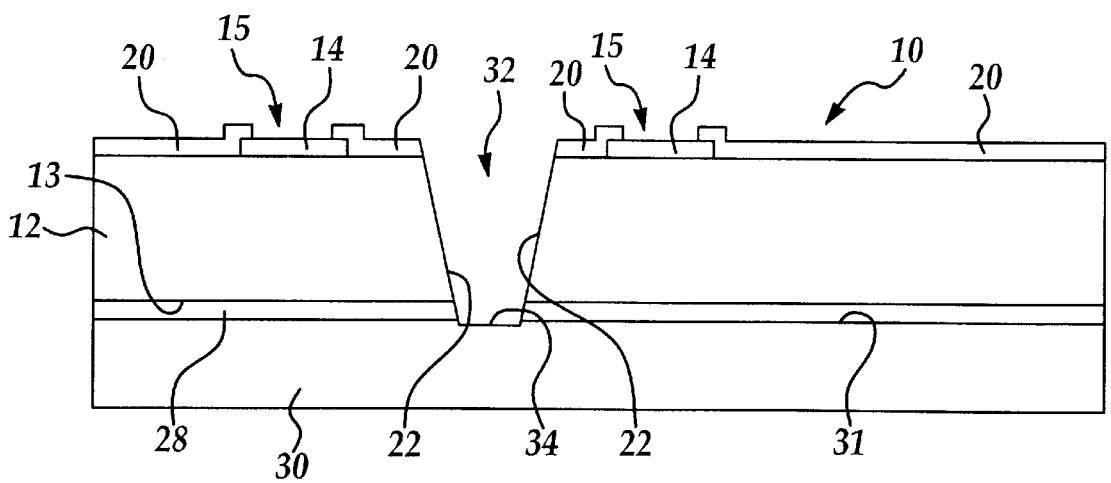
FIG. 2C illustrates an embodiment, of the invention including forming a trench in the subassembly.

As shown in FIG. 2C, a trench 32 is formed in the subassembly through the silicon based substrate 12 at this location of the second opening 19 in the passivation layer or through the passivation layer 20 if the passivation layer 20 covers the entire silicon based substrate upper surface 21 except for the openings 15 overlying the bond pad 14. The trench 32 may be formed by any method known to those skilled in your including, but not limited to, etching, laser cutting, or mechanical cutting. The trench 32 extends completely through the silicon based substrate 12, through the ground layer 28 forming a lower trench surface 34 in the second substrate 30. Thus, the trench is defined in part by side walls 22 of the silicon based substrate 12 and the lower trench wall 34 formed in the second substrate 30. Obviously, if the trench 32 extends only through the ground layer 28, the bottom trench face 34 may be the same as the top face 31 of the second substrate. In an alternative embodiment, the ground layer 28 may be relatively thick and the trench may be formed so that it does not extend entirely through the ground layer 28.

Figure 2D:
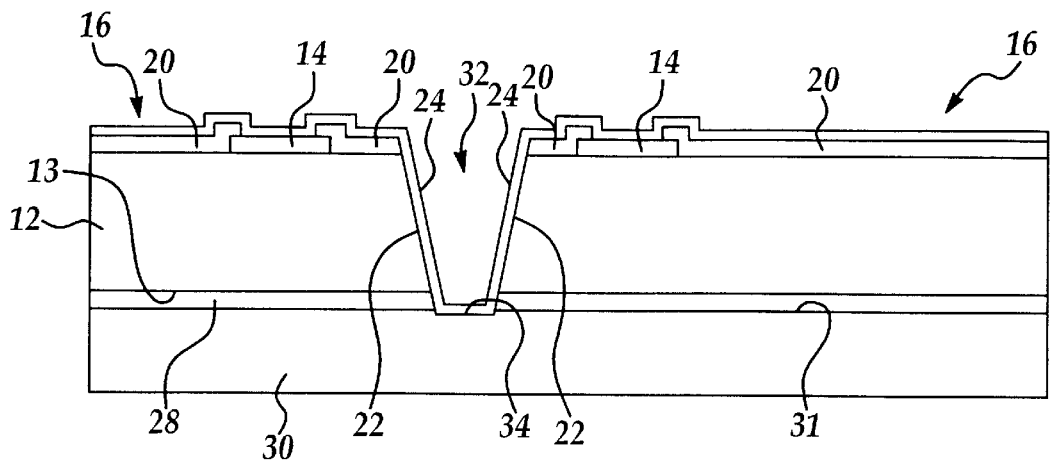
FIG. 2D illustrates an embodiment of the invention including forming an electrically conductive redistribution trace over the subassembly and into the trench.

As shown in FIG. 2D, an electrically conductive redistribution layer 16 is formed over the semiconductor wafer 10 so that a portion of the electrically conductive redistribution layer 16 overlies the bond pad 14 and extends over the side walls 22 of the silicon based substrate 12 down to the electrically conductive ground layer 28 and over the lower trench surface 34 formed in the second substrate 30. An electrically conductive redistribution trace 16 may also extend horizontally from the bond pad so that an electrically conductive bump may be positioned thereon in a laterally spaced apart relationship with the bond pad 14 as will be described hereafter.

Figure 2E:
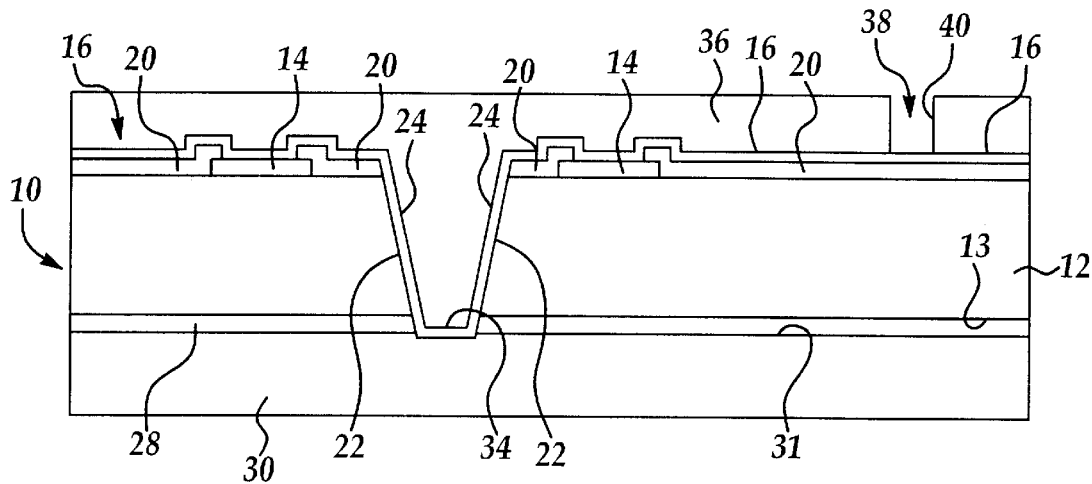
FIG. 2E illustrates an embodiment of the invention including forming a passivation or encapsulation layer over the subassembly including an opening formed in the passivation or encapsulation layer at a location spaced laterally apart from the bond pad and overlying the redistribution trace.

As shown in FIG. 2E, a passivation or encapsulation layer 36 may be formed over the semiconductor wafer 10 including the electrically conductive redistribution trace 16. The encapsulation layer 36 may include any material known to those skilled in the art including, but not limited to, epoxy, ester, silicone, or urethane based materials. A hole 38 may be provided or formed in the encapsulation layer 36 overlying the electrically conductive redistribution trace 16 in a positioned horizontally and laterally spaced from the bond pad 14. The opening 38 in the encapsulation layer 36 may be defined in part by side walls 40 extend down to the electrically conductive redistribution trace 16.

Figure 2F:
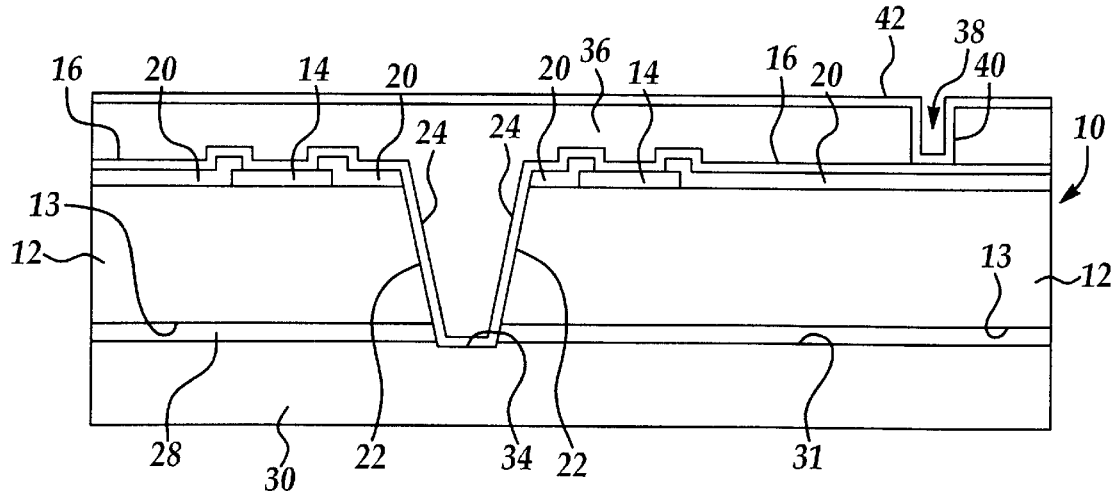
FIG. 2F as illustrates an embodiment of the invention including forming a seed or barrier layer over the encapsulation layer and into the opening formed therein down to the redistribution trace.

As shown in FIG. 2F, a seed layer or barrier layer 42 may be deposited over the semiconductor wafer including the encapsulation layer 36 and down the side walls 40 of the encapsulation layer and onto or overlying the electrically conductive redistribution trace 16. The seed layer or barrier layer 42 may include any electrically conductive material known to those skilled in the art, including but not limited to, metals and alloys, and electrically conductive composite and resins, for example, a thin layer of copper or Ti. The seed layer or barrier layer 42 may be deposited or formed by any of a variety of methods known to those skilled in the art including electroplating or sputtering.

Figure 2G:
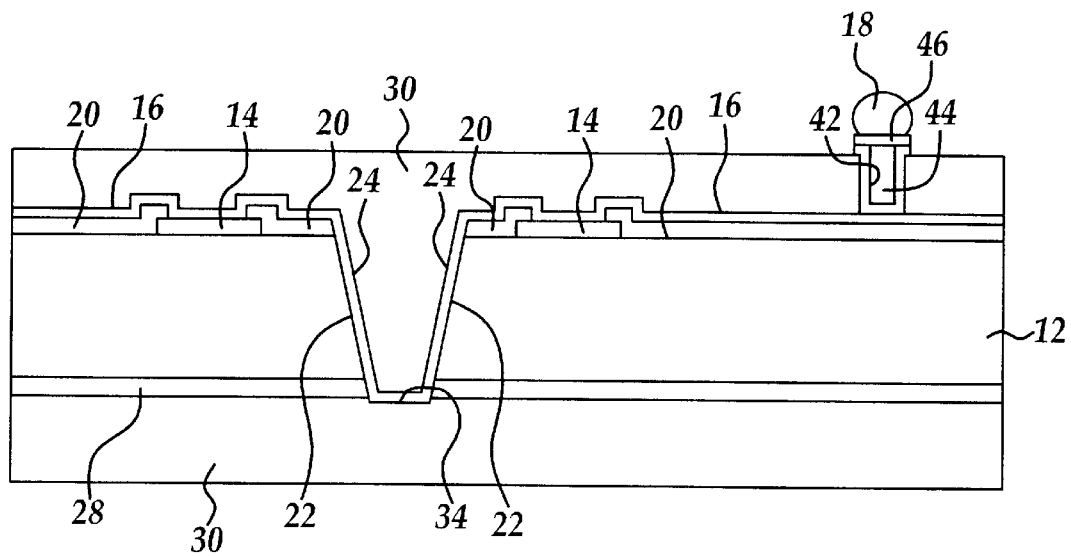
FIG. 2G illustrates an embodiment of the present invention including forming a post in the opening in the encapsulation layer over the seed layer, forming an under bump metallurgy over the post, and forming an electrically conductive bump over the under bump metallurgy.

As shown in FIG. 2G, an electrically conductive post 44 is formed in the opening 38 in the encapsulation layer over the seed layer or barrier layer 42 if present. The electrically conductive post 44 may be made from any electrically conductive material, such as metals and alloys, electrically conductive compositions and resins, for example, including copper. The electrically conductive post 44 may be deposited or formed by any method known to those skilled in the art including screen printing, electroplating, electroless plating, or sputtering.

The under bump metallurgy 46 may be deposited over the electrically conductive post 44. Ball limiting metallurgy (BLM) or under bump metallurgy (UBM) generally consists of successive layers of metal. The "adhesion" layer must adhere well to both the bond pad metal or post 44 and the surrounding passivation or seed layer 42, provide a strong, low-stress mechanical and electrical connection. The "diffusion barrier" layer prevents the diffusion of electrically conductive bump material such as solder into the underlying material. The "solder wettable" layer provides a wettable surface for the molten solder during the solder bumping process, for good bonding of the solder to the underlying metal. a variety of UBM structures are known to those skilled in the art that accomplish the above functions and have one, two, three or more layers depending on whether the bump is gold, copper, aluminum, solder or nickel based. For gold based bumps, known UBM structure include layers of Cr—Cu, Ti—Pd, Ti—W, or Ti—Pt. For copper based bumps, known UBM structures include layers of Cr—Cu, or Al—Ni. For aluminum based bumps, known UBM structure include layers of Ti or Cr. For solder based bumps, known UBM structures include layers of Cr—Cu—Au, Ni—Cu, Ti—Cu, TiW—Cu, Ni—Au, or Al—NiV—Cu. For nickel based bumps, known UBM structure include layers of nickel. The UBM layers may be deposited by electroplating, evaporation, printing, electroless plating, and/or sputtering. It is also known to deposit one or more seed layers over the UBM structure prior to depositing the electrically conductive material (such as solder) that forms the bump.

An electrically conductive bump 18 is then formed to overlie the electrically conductive redistribution trace 16 at a positioned horizontally or laterally spaced from the bond pad 14. A variety of materials may be interposed between the electrically conductive bump 18 and the redistribution trace 16 including, but not limited to, the seed layer 42, post 44, and under bump metallurgy 46. The electrically conductive bump 18 may be formed by any of the methods described in the background of the invention including but not limited to electroplating, electroless plating, sputtering, screen printing, or micro-punching. Typically a pre-bump structure is formed by one of these methods and then the pre-bump structure is reflown to form the electrically conductive bump 18 which has a spherical like shape. Excess under bump metallurgy 46 and seed layer 42 may be removed by etching using the electrically conductive bump 18 as a mask. The electrically conductive bump 18 may include any electrically conductive material, such as metals and alloys, electrically conductive composites and resins, including but not limited to solder, copper, gold, Ni. If solder is utilized for the electrically conductive bump 18 a composition may be any known to those skilled in the art including 63 weight percent Pb and 37 weight percent Sn.

Figure 2H:
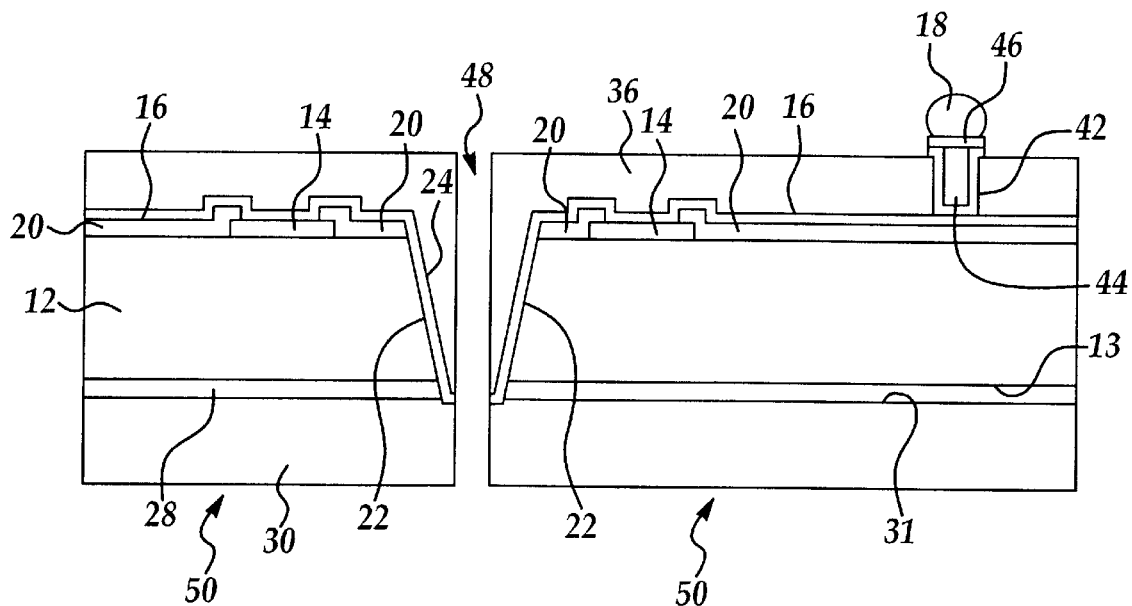
FIG. 2H illustrates an embodiment of the present invention including singulating individual microelectronic devices from the subassembly so that at least one bond pad is electrically connected to the ground layer interposed between the first substrate and a second substrate.

As shown in FIG. 2H a second trench 48 may be formed through the encapsulation material 36 and through the second substrate 30 to provide individual microelectronic devices 50. Each microelectronic device 50 includes at least one bond pad 14 that is electrically connected to the ground layer 28 positioned between the silicon based substrate 12 and second substrate 30. In one embodiment the bond pad 14 is electrically connected to the ground layer 28 by a portion 24 of the electrically conductive trace 16 that extends from the bond pad 14 along the side wall 22 of the silicon based substrate 12 to the ground layer 28. A second portion or a second electrically conductive redistribution trace may extend horizontally from the bond pad 14 so that the electrically conductive bump 18 may be electrically connected to the second portion of the electrically conductive redistribution trace 16.

Figure 1:
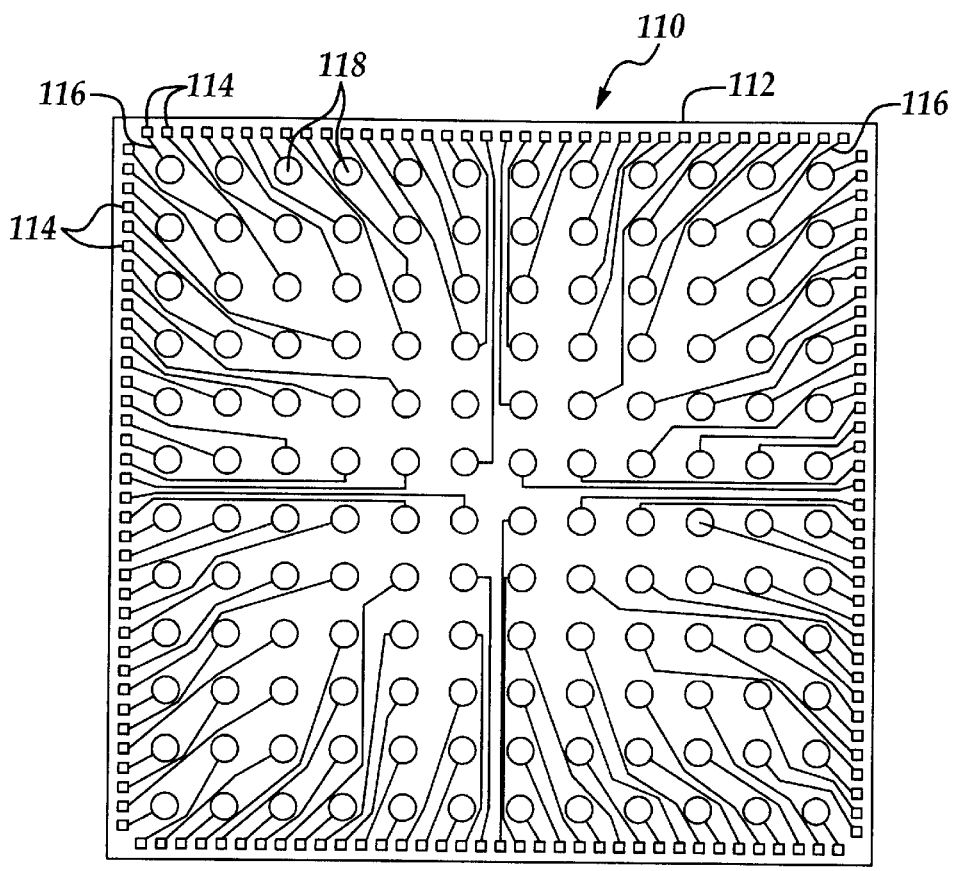
FIG. 1 is a plan view of a prior art wafer level chip scale package.
Figure 3:
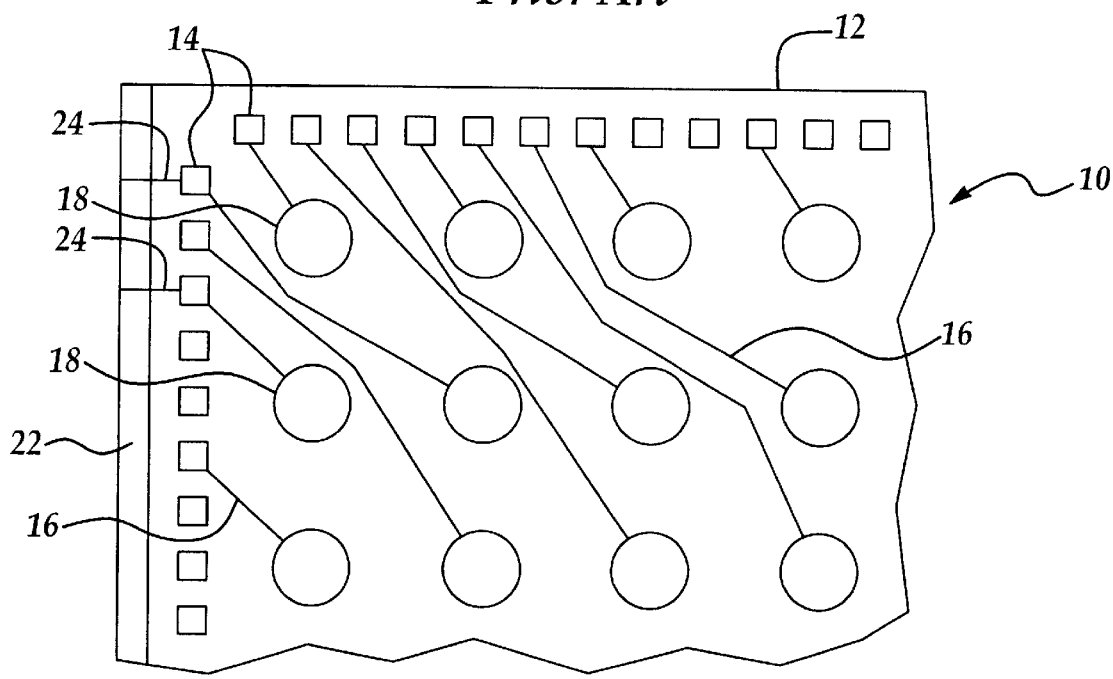
FIG. 3 is a enlarged plan view with portions broken away of a microelectronic device according to the present invention illustrating a bond pad and electrically conductive redistribution trace extending therefrom over a side wall of the first substrate.

FIG. 3 is an enlarged plan view with portions broken away illustrating one embodiment the present invention. As will be appreciated, a portion 24 of the electrically conductive redistribution trace extends from the bond pad 14 along the side wall 22 formed in the silicon based substrate 12. The portion 24 of the electrically conductive redistribution trace may cover only a portion of the side wall 22 of the silicon based substrate 12 or may cover the entire surface of the side wall 22. In another embodiment of the present invention, at least two bond pads 14 are electrically connected to the ground layer 28 by, for example, portions 24 of the electrically conductive redistribution trace 16.

As used herein, the terms "overlies or overlying" is used to describe the location of various structures means that the first structure may be in direct physical contact with the second structure that overlies the first structure or additional structures or features may be interposed between the first and second structures. Particularly, with respect to the electrically conductive components, a first structure may overlie a second structure with additional structures or features interposed so that the first and second structures are electrically connected together.

What is claimed is:

1. A microelectronic device comprising:
    a first and a second substrate;
    a ground layer interposed between the first substrate and the second substrate;
    the first substrate including a plurality of bond pads, electrically conductive bumps, and a first redistribution trace, and wherein the first redistribution trace extends from one of the bond pads to the ground layer interposed between the first substrate and the second substrate.

2. The microelectronic device as set forth in claim 1 wherein the first substrate includes a top face and a bottom face and a side wall extending from the top face to the bottom face, and wherein the first redistribution trace extends from one of the bond pads to the ground layer over the side wall.

3. The microelectronic device as set forth in claim 1 wherein the first substrate includes a top face and a bottom face, and a side wall extending from the top face to the bottom face, and wherein the plurality of bond pads includes a first bond pad, and wherein the first redistribution trace extends from the first bond pad along the side wall of the first substrate to the ground layer, and further including a second redistribution trace extending generally horizontally from the first bond pad, and further including an electrically conductive bump electrically connected to the second redistribution trace.

4. The microelectronic device as set forth in claim 3 further comprising an electrically conductive post interposed between the second redistribution trace and the electrically conductive bump.

5. The microelectronic device as set forth in claim 3 further comprising an under bump metallurgy interposed between the second redistribution trace and the electrically conductive bump.

6. The microelectronic device as set forth in claim 4 further comprising an under bump metallurgy interposed between the electrically conductive post and the second redistribution trace.

7. The microelectronic device as set forth in claim 6 further comprising a seed layer interposed between the electrically conductive post and the second redistribution trace.

8. The microelectronic device as set forth in claim 4 wherein the electrically conductive post comprises copper.

9. The microelectronic device as set forth in claim 1 wherein the bond pads comprise aluminum.

10. The microelectronic device as set forth in claim 8 wherein the seed layer comprises copper.

11. The microelectronic device as set forth in claim 1 further comprising a barrier layer interposed between the copper post and the second electrically conductive redistribution trace.

12. The microelectronic device as set forth in claim 1 wherein the ground layer comprises gold.

13. The microelectronic device as set forth in claim 1 wherein the first electrically conductive redistribution trace covers the entire surface of the side wall of the first substrate.

14. The microelectronic device as set forth in claim 1 wherein the ground layer covers the entire surface of the bottom face of the first substrate.

15. The microelectronic device as set forth in claim 1 wherein the first substrate comprises a semiconductor wafer.

16. The microelectronic device as set forth in claim 1 wherein the second substrate comprises a glass based material.

17. The microelectronic device as set forth in claim 1 wherein the second substrate comprises a second semiconductor wafer.

18. The microelectronic device as set forth in claim 1 wherein the second substrate comprises a printed circuit board.

19. The microelectronic device as set forth in claim 1 wherein the second substrate comprises a ceramic substrate.

20. A microelectronic device comprising:
    a first substrate having a top face, bottom face and a side wall extending from the top face to the bottom;
    the first substrate including a plurality of bond pads, electrically conductive bumps, and redistribution traces, and a ground layer on the bottom face of the first substrate, and wherein at least one of the redistribution traces extends from one of the bond pads to the ground layer.

* * * * *